United States Patent
Yamada et al.

(10) Patent No.: US 6,479,174 B1
(45) Date of Patent: Nov. 12, 2002

(54) SILICON CARBIDE BODY

(75) Inventors: Hirotake Yamada, Anjo (JP); Makoto Murai, Nagoya (JP); Hiroshi Furukubo, Ichinomiya (JP); Tsuneaki Ohashi, Ogaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/543,931

(22) Filed: Apr. 6, 2000

(30) Foreign Application Priority Data

Apr. 7, 1999 (JP) .............................. 11-100225

(51) Int. Cl.$^7$ ................. C25D 321/00; C25D 323/00; C25D 381/00
(52) U.S. Cl. ................ 428/698; 428/446; 428/408; 428/323; 428/332; 501/88
(58) Field of Search ............................ 501/88; 428/446, 428/698, 469, 408, 323, 332

(56) References Cited

U.S. PATENT DOCUMENTS 6,147,020 A * 11/2000 Nishioka et al.

FOREIGN PATENT DOCUMENTS

| EP | 0 582 444 A1 | 2/1993 |
| EP | 0 992 608 A1 | 4/2000 |
| JP | 1-224286 | 9/1989 |
| JP | 10-256108 | 9/1998 |

OTHER PUBLICATIONS

Geola, J.S. Et Al: "Transparent Chemical Vapor Deposited –SIC": Applied Physics Letters, US, American Institute of Physics. New York, vol. 64, No. 2, Jan. 10, 1994, pp. 131–133, XP000416573, ISSN: 0003–6951.

Chinone Y Et Al: "Fabrication and Characterization of High Purity SIC Wafer Prepared by CVD" Extended Abstracts, US, Electrochemical Society. Princeton, New Jersey, vol. 89/2, Jan. 1, 1989, p. 726 XP000277197, ISSN: 0160–4619.

Riviere J P Et Al: "Study of SIC Coatings Prepared by Dynamic Ion Mixing" Materials Letters, NL, North Holland Publishing Company. Amsterdam, vol. 16, No. 2/03, Mar. 1, 1993, pp. 79–83, XP000355182, ISSN: 0167–577X.

Pickering M A Et Al: "Chemically Vapor Deposited Silicon Carbide (SIC) for Optical Applications", Nuclear Instruments * Methods in Physics Research, Section—A:Accelerators, Spectrometers, Detectors and Associated Equipment, NL, North Holland Publishing Company. Amsterdam, vol. A291, 1990, pp. 95–100, XP000669880, ISSN: 0168–9002 No Month.

* cited by examiner

*Primary Examiner*—Deborah Jones
*Assistant Examiner*—Jennifer McNeil
(74) *Attorney, Agent, or Firm*—Burr & Brown

(57) ABSTRACT

A silicon carbide body includes polycrystals of silicon carbide, and has a purity of silicon carbide of not less than 99.9999 wt %, a relative density of not less than 99% and a ratio of silicon of not less than 70.12 wt %.

19 Claims, 1 Drawing Sheet

SILICON CARBIDE BODY

BACKGROUND OF THE INVENTION (1) Field of the Invention

The present invention relates to silicon carbide bodies of which resistivity is enhanced.

(2) Related Art Statement

For example, JP-A 10-256,108 and JP-A 01-224,286 describe methods for producing films of silicon carbide on surfaces of substrates such as graphite by the chemical vapor deposition method. Such silicon carbide films tend to exhibit high density and high erosion resistance.

The present inventors have been required to obtain films of silicon carbide having increased electric resistivity and resistance, because there is a demand for the formation of films of highly resistive silicon carbide in the field of semiconductor-producing apparatuses. However, it has been difficult to increase the electric resistivity of films of silicon carbide beyond a certain level even by changing various producing conditions in performing the chemical vapor deposition method, such as the flow rates of a carrier gas, a silicon source gas and a carbon source gas, a film-forming temperature and a film-forming time period in any way.

SUMMARY OF THE INVENTION

It is an object of the present invention to provide a dense silicon carbide body which has a high purity and a high relative density and of which electric resistivity is enhanced.

The present invention relates to a silicon carbide body comprising polycrystals of silicon carbide, which silicon carbide body has a purity of silicon carbide of not less than 99.9999 wt %, a relative density of not less than 99% and a ratio of silicon of not less than 70.12 wt %. The purity of the silicon carbide body being not less than 99.9999 wt % means that the total weight of all metallic elements excluding Si and C is less than 0.0001 wt %.

These and other objects, features and advantages of the invention will be appreciated when taken in conjunction with the attached drawings, with the understanding that some modifications, variations and changes of the invention could be made by the skilled person in the art to which the invention pertains.

BRIEF DESCRIPTION OF THE DRAWING

For a better understanding of the invention, reference is mad to the drawing, wherein.

DETAILED DESCRIPTION OF THE INVENTION

Figure 1:
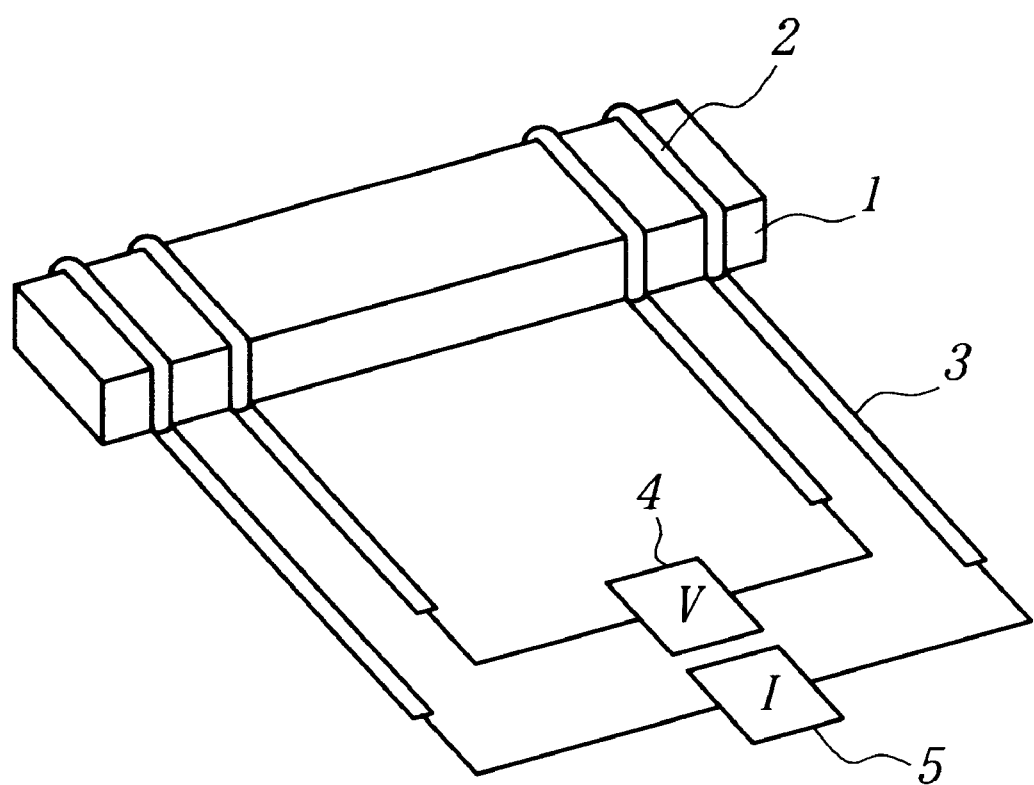
FIG. 1 is a view for schematically illustrating a device for measuring the electric resistivity of the silicon carbide body.

Now, the present invention will be explained in more detail below.

The present inventors discovered that the electric resistivity of the silicon carbide body is rapidly raised by increasing the ratio of silicon in the silicon carbide body under contriving producing conditions at the time of the chemical vapor deposition growth reaction when the content of silicon is in a given range. The inventors reached the present invention based on this discovery.

It has been considered impossible or difficult to increase the electric resistivity of the highly pure and dense silicon carbide bodies as obtained by the chemical vapor deposition growth method with no doping beyond a certain level.

Silicon carbide itself has several crystalline phases. According to a literature: Hiromoto MATSUWATARI, etc., "SiC Semiconductor Materials, Devices and Conductor Materials", Vol. 33, No. 6, pp 720 to 724, 1994, however, changes in the electric resistivity are around 2 times at the maximum due to differences in the crystalline phases when calculated based on carrier transmission degrees of the respective crystalline phases. On the other hand, increase in the electric resistivity of the silicon carbide body according to the present invention is conspicuous, which cannot be explained based on the crystalline phases.

The main crystalline phase of the silicon carbide body according to the present invention is preferably a 3C crystalline phase and/or 6H crystalline phase.

When silicon carbide is used as a material for members in the field of producing semiconductors, it is necessary that the purity of the silicon carbide body is not less than 99.9999%, and that the relative density is equal to that of a completely compacted body having the identical density as considered in an order of 0.1%. The silicon carbide body according to the present invention is preferably formed by the chemical vapor deposition method. However, so long as the high purity and the high relative density mentioned above can be realized, the silicon carbide body may be produced by other gas phase methods. Therefore, the present invention is not limited to any particular one.

The content of silicon in the silicon carbide body is preferably not less than 70.17 wt % when measured by a method mentioned later. No upper limitation is posed upon the content of silicon, but it is easy to produce the silicon carbide body with not more than 70.40 wt % of silicon according to a usual producing condition. The content of silicon in the silicon carbide body is the total content (wt %) of Si in the SiC crystals and in the grain boundaries.

No particular limitation is posed upon a substrate on which a film of the silicon carbide body is to be formed, but the following are particularly preferred:

(1) sintered body composed mainly of silicon carbide: for example, (a) a sintered body composed of not less than 90 wt % of silicon carbide and having a relative density of not less than 90%, or (b) a porous sintered body composed of not less than 90 wt % of silicon carbide and having a relative density of 56% to 90%;

(2) a mixed sintered body of silicon carbide and metallic silicon;

(3) insulating ceramics such as silicon nitride and aluminum nitride; and (4) graphite.

For production reasons, the silicon carbide body is preferably in the form of a film, but a bulky shape may be acceptable for the silicon carbide body. If the silicon carbide body is filmy, the film thickness of the silicon carbide body is preferably not less than 50 $\mu$m, because such a film of the silicon carbide body can stably cover the entire surface of the substrate. Further, for economical reasons, the film thickness of the silicon carbide body is not more than 3000 $\mu$m. The thickness of the silicon carbide film is preferably not less than 100 $\mu$m.

The electric resistivity of the silicon carbide body according to the present invention is preferably not less than 100,000$\Omega$·cm. For example, if an outer peripheral portion of a site where a wafer is to be placed is made of a highly resistive material in an etcher as one of the semiconductor-producing apparatuses, the density of a plasma gas as an etching gas can be increased.

The average particle diameter of the crystals of silicon carbide constituting the silicon carbide body is preferably not more than 5 μM. That is, the present inventors discovered that the electric resistance of the silicon carbide body can be further increased by decreasing the average particle diameter of the crystals. The reason for this is not clear, but it may be that grain boudaries of the crystals of silicon carbide function as a carrier trap.

The silicon carbide body according to the present invention may be produced by the following method, for example.

A film made of silicon carbide is formed on an appropriate substrate according to CVD (chemical vapor deposition) in a temperature range of 1250° C. to 1350° C. in an inner pressure range of 100 to 300 torr inside a CVD furnace at a film-forming speed (i.e., a film thickness-increasing speed) of not less than 20 μm/hr and not less than 100 μm/hr, preferably of not less than 20 μm/hr and not less than 60 μm/hr, while a mixed raw gas of $SiC_4$ and $CH_4$ is fed at a Si/C molar ratio of 1.3 to 1.6, the feed rate of the mixed raw gases is in a range of $7.3 \times 10^{-5}$ mol/minute per $cm^2$ to of $9.0 \times 10^{-5}$ mol/minute per $cm^2$ of the surface of the substrate, and a carrier gas (hydrogen gas or the like) is fed at a ratio of $H_2$/Si molar ratio of 3.5 to 4.5.

Next, a method for measuring the particle diameters will be explained. A silicon carbide body is ground, and a surface-scanning type electron microscope photograph is taken at a magnification of 1000 times from a direction vertical to the ground surface. Each of lateral and vertical sizes of this photograph is enlarged twice while its view is being maintained, thereby obtaining a test photograph. Five or more arbitrary straight lines are drawn on the test photograph from one edge to the other. Intersections between the straight lines and the grain boundary of each particle which the straight lines pass are specified. With respect to each particle, since two intersections ordinarily exist, a distance between the two intersections is measured as a particle diameter thereof.

EXAMPLE

Each film of silicon carbide as shown in Table 1 was formed on a substrate made of a Si-SiC composite material by the chemical vapor deposition method. The substrate had a planar shape having a vertical size of 50 mm and a lateral size of 50 mm in opposite main surfaces and a thickness of 9 mm. One of the main surfaces of the substrate was ground to a center-line average surface roughness Ra of less than 3 μm with a grinding stone of #800 or more. The substrate was housed and placed in a chemical vapor deposition furnace. At that time, the opposed main surfaces of the substrate were set to be in parallel to an ejecting direction of reactive gases, that is, a side face of the planar substrate was opposed to a gas-ejecting opening.

The interior of the furnace was evacuated to vacuum, replaced with argon gas, and heated to a given reacting temperature. The furnace was heated to 1320 to 1350° C. in Experiment Nos. 3 to 6. In Experiment Nos. 1 and 2, the furnace was heated to 1380 to 1450° C. If the film-forming temperature is adjusted to a low temperature range, there is the possibility that the ease by which silicon and carbon are absorbed on the substrate changes so that the absorbing amount of silicon may increase. Further, it seems that the polycrystalline particles of silicon carbide are more uniform and variations in size of the polycrystalline particles of silicon carbide are small so that there are no coarse particles.

Then, argon or hydrogen was used as a carrier gas, and $SiCl_4$ and $CH_4$ were introduced as reactive gases. In Experiment Nos. 1 and 2, the ratio of Si to C was adjusted to Si/C=1.1 to 1.3 (volume ratio when calculated in the standard state). In Experiment Nos. 3 to 6, the ratio of Si to C was adjusted to Si/C=1.3 to 1.6 (volume ratio when calculated in the standard state). The pressure inside the furnace was adjusted to 100 to 300 Torr. Film forming was effected for 30 to 50 hours, followed by cooling, thereby obtaining a film of silicon carbide in a thickness of 3 to 5 mm.

A planar test piece having a dimension of 2×4×40 mm was cut out from each of films of silicon carbide. With respect to each test piece, the average particle diameter of the silicon carbide particles was measured as mentioned above, and the electric resistance and the content ratio of silicon thereof were measured as mentioned later.

With respect to each test piece, the content ratio of silicon was measured in the following analysis manner. This measurement is described in detail in Japanese Patent Application No. 10-295,067 as an analysis method capable of accurately measuring the content ratio of silicon.

That is, each test piece was ground to 3 mm or less, the ground powder pieces were placed on a platinum plate, and sodium carbonate, boric acid and iron oxide were added thereunto. Sodium carbonate and boric acid are fluxes used in melting silicon carbide. Iron oxide is a catalyst to accelerate an oxidation reaction between silicon carbide and the fluxes. At that time, it is considered that silicon in silicon carbide is converted to sodium silicate, and that iron is converted to a sodium salt.

The thus obtained reaction mixture is dissolved in hydrochloric acid. Sodium silicate is insoluble in hydrochloric acid. Iron is converted into iron chloride that is dissolved in hydrochloric acid. Then, when polyethylene oxide is added into the hydrochloric solution, insoluble sodium silicate flocculates to produce a jelly precipitate mainly containing sodium silicate.

Then, this precipitate is filtered, and washed with warm water. At this time, around 1% of sodium silicate is dissolved in washing with warm water, and moves into the warm wash water (B). Sodium is washed off with warm water, and the precipitate of sodium silicate is converted to $SiO_2 \cdot H_2O$ (hydrous silicic acid). This precipitate is strongly heated to remove water and a filter paper, thereby obtaining a precipitate (A) mainly containing $SiO_2$.

Next, hydrofluoric acid was added to the precipitate (A) mainly containing $SiO_2$ to evaporate silicon dioxide. This reaction proceeds as $SiO_2 + 4HF \rightarrow SiF_4$ (evaporated) $+ 2H_2O$. The residue left is strongly heated, and the weight of the resulting residue is measured. The total weight of silicon dioxide present in the precipitate (A) is determined from a difference of the thus-measured weight and the weight before the addition of the hydrofluoric acid.

The amount of soluble silicon in the above warm wash water (B) is measured by a high frequency plasma emission spectrochemical analysis. The measured weight of silicon present in the precipitate (A) and that of silicon present in the warm wash water (B) are summed to calculate the total weight of silicon. Each measured result is shown in Table 1.

Further, with respect to each test piece, a scanning type electron microscopic photograph (magnification: 1000 times) was taken from a direction orthogonal to a surface thereof, and the average particle diameter was measured as mentioned before.

As shown in FIG. 1, alumel wires 3 were wound around each test piece 1 at four locations, and connected to an ampere meter 5 and a potentiometer 4, and an electric resistivity of the silicon carbide body was measured according to a four-terminal method. In order to ensure conduction between the alumel wires 3 and the test piece 1, a carbon paste 2 was applied between the alumel wires and the surface of the test piece 1. Constant current was passed through two outer alumel wires (current terminals) of the four, and a voltage between the two inner wires (voltage terminals) was measured. Measurement was effected in a room, while the sample being kept at 20° C., 100° C. or 200° C. in an oven. The electric resistivity at this time was calculated according to the following formula.

Electric resistivity=(width×thickness of test piece× voltage)÷(distance between voltage terminals×current)

TABLE 1

| Experiment No. | Ratio of Si (wt %) | Purity (%) | Relative density (%) | Article particle diameter ($\mu$m) | Electric resistivity at 20° C. ($\Omega$·cm) | Electric resistivity at 100° C. ($\Omega$·cm) | Electric resistivity at 200° C. ($\Omega$·cm) |
|---|---|---|---|---|---|---|---|
| 1 | 70.04 | >99.9999 | >99 | 5.9 | 790 | 250 | 70 |
| 2 | 70.11 | >99.9999 | >99 | 5.7 | 790 | 260 | 100 |
| 3 | 70.14 | >99.9999 | >99 | 4.7 | 170000 | 8800 | 1500 |
| 4 | 70.16 | >99.9999 | >99 | 4.7 | 170000 | 10000 | 1700 |
| 5 | 70.18 | >99.9999 | >99 | 4.3 | 1000000 | 40000 | 11000 |
| 6 | 70.24 | >99.9999 | >99 | 4.4 | 1000000 | 45000 | 12000 |

As is seen from the above results, it is clarified that the electric resistance of the highly pure and dense silicon carbide body can be largely increased by setting the content ratio of silicon to not less than 70.12 wt %.

Further, with respect to each of the test pieces in Experiment Nos. 1 to 6, X-ray diffraction measurement was performed by using a K$\alpha$-Cu line. As a result, all the test pieces showed the 3C crystalline structure. Relative to the peak intensity corresponding to a (111)plane in a diffraction angle range 2$\theta$=20° to 80°, the total ratio of peak intensities corresponding to the other planes was not less than 20% in Experiment Nos. 1 and 2 and not more than 20% in Experiment Nos. 3 to 6.

Furthermore, a second measurement of each of the test pieces in Experiment Nos. 3, 4, 5 and 6 after heating at 2000° C. or more in an argon atmosphere revealed that the electric resistivity increased to 10 to 100 times that before the heat treatment. The above results suggest that the silicon carbide bodies as thermally treated are more preferable.

As having been explained, according to the present invention, the electric resistivity of the highly pure and dense silicon carbide body having high relative density can be increased.

What is claimed is:

1. A silicon carbide body comprising polycrystals of silicon carbide, said silicon carbide body having a purity of silicon carbide of not less than 99.9999 wt %, a relative density of not less than 99% and a ratio of silicon of not less than 70.12 wt %, wherein the average particle diameter of the silicon carbide crystals is not more than 5 $\mu$m.

2. The silicon carbide body set forth in claim 1, which has an electric resistivity of not less than 100,000$\Omega$·cm at 20° C.

3. The silicon carbide body set forth in claim 2, which is a film formed by a chemical vapor deposition method.

4. The silicon carbide body set forth in claim 1, which has an electric resistivity of not less than 1000$\Omega$·cm at 200° C.

5. The silicon carbide body set forth in claim 4, which is a film formed by a chemical vapor deposition method.

6. The silicon carbide body set forth in claim 1, which is a film formed by a chemical vapor deposition method.

7. The silicon carbide body set forth in claim 1, which is a film formed by a chemical vapor deposition method.

8. A composite body comprising a substrate, and a silicon carbide body formed on the substrate and comprising polycrystals of silicon carbide. said silicon carbide body having a purity of silicon carbide of not less man 99.9999 wt %, a relative density of not less than 99% and a ratio of silicon of not less than 70.12 wt %, wherein the average particle diameter of the silicon carbide crystals is not more than 5 $\mu$m.

9. The composite body set forth in claim 8, wherein the substrate is made of a sintered body composed mainly of silicon carbide or graphite.

10. The composite body set forth in claim 9, wherein the silicon carbide body has an electric resistivity of not less than 100,000$\Omega$·cm at 20° C.

11. The composite body set forth in claim 9, wherein the silicon carbide body has an electric resistivity of not less than 1,000$\Omega$·cm at 200° C.

12. The composite body set forth in claim 9, wherein the silicon carbide body is a film formed by a chemical vapor deposition method.

13. The composite body set forth in claim 9, wherein the sintered body is a sintered body composed of not less than 90 wt % of silicon carbide and having a relative density of not less than 90%, a porous sintered body composed of not less than 90 wt % of silicon carbide and having a relative density of 56% to 90%, a mixed sintered body of silicon carbide and metallic silicon, or an insulating ceramics such as silicon nitride and aluminum nitride.

14. The composite body set forth in claim 13, wherein the silicon carbide body has an electric resistivity of not less than 100,000$\Omega$·cm at 20° C.

15. The composite body set forth in claim 13, wherein the silicon carbide body has an electric resistivity of not less than 1,000$\Omega$·cm at 200° C.

16. The composite body set forth in claim 13, wherein the silicon carbide body is a film formed by a chemical vapor deposition method.

17. The composite body set forth in claim 8, wherein the silicon carbide body has an electric resistivity of not less than 100,000$\Omega$·cm at 20° C.

18. The composite body set forth in claim 8, wherein the silicon carbide body has an electric resistivity of not less than 1,000$\Omega$·cm at 200° C.

19. The composite body set forth in claim 8, wherein the silicon carbide body is a film formed by a chemical vapor deposition method.

* * * * *